United States Patent
Hirochi et al.

(10) Patent No.: US 12,255,069 B2
(45) Date of Patent: Mar. 18, 2025

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventors: Yukitomo Hirochi, Toyama (JP); Takashi Nogami, Toyama (JP); Norichika Yamagishi, Toyama (JP); Yoshihiko Yanagisawa, Toyama (JP)

(73) Assignee: Kokusai Electric Corporation, Tokyo (JP)

(*) Notice: Subject to any disclaimer, the term of this patent is extended or adjusted under 35 U.S.C. 154(b) by 859 days.

(21) Appl. No.: 17/175,274

(22) Filed: Feb. 12, 2021

(65) Prior Publication Data
US 2021/0166945 A1 Jun. 3, 2021

Related U.S. Application Data

(63) Continuation of application No. PCT/JP2018/031197, filed on Aug. 23, 2018.

(51) Int. Cl.
*H05B 6/76* (2006.01)
*H01L 21/26* (2006.01)
(Continued)

(52) U.S. Cl.
CPC ...... *H01L 21/268* (2013.01); *H01L 21/67115* (2013.01); *H01L 21/67253* (2013.01); *H05B 6/68* (2013.01)

(58) Field of Classification Search
CPC ............ H01L 21/268; H01L 21/67115; H01L 21/67248; H01L 21/67253;
(Continued)

(56) References Cited

U.S. PATENT DOCUMENTS

| | | | | |
|---|---|---|---|---|
| 3,889,009 A | * | 6/1975 | Lipoma | B65B 55/16 426/243 |
| 2002/0017033 A1 | * | 2/2002 | Wefers | F26B 5/048 34/264 |
| 2015/0147894 A1 | | 5/2015 | Hamano et al. | |

FOREIGN PATENT DOCUMENTS

| | | |
|---|---|---|
| JP | 07-135196 A | 5/1995 |
| JP | 2013-073947 A | 4/2013 |
| WO | 2014038667 A1 | 3/2014 |

* cited by examiner

*Primary Examiner* — Quang T Van
(74) *Attorney, Agent, or Firm* — Edell, Shapiro & Finnan, LLC

(57) ABSTRACT

According to one aspect of the technique, there is provided a substrate processing apparatus including: a process housing including a process chamber in which a substrate is processed; a transfer housing provided adjacent to the process housing and having a transfer chamber wherein the substrate is transferred between the process chamber and the transfer chamber; a microwave generator configured to transmit a microwave to be supplied into the process chamber; a loading/unloading port connecting between the process chamber and the transfer chamber and through which the substrate is transferred; an opening/closing structure configured to open or close the loading/unloading port; and a detection sensor provided in the transfer chamber adjacent to the loading/unloading port and configured to detect the microwave leaking to the transfer chamber from the process chamber through the loading/unloading port while the opening/closing structure maintains the loading/unloading port closed.

9 Claims, 8 Drawing Sheets

(51) Int. Cl.
*H01L 21/268* (2006.01)
*H01L 21/67* (2006.01)
*H05B 6/68* (2006.01)

(58) Field of Classification Search
CPC ........ H01L 21/67766; H01L 21/67781; H05B 6/68; H05B 6/76
USPC ....... 219/716, 700, 770, 775, 776, 774, 651, 219/736, 737, 738
See application file for complete search history.

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This application is a continuation of International Application No. PCT/JP2018/031197, filed on Aug. 23, 2018.

TECHNICAL FIELD

The present disclosure relates to a substrate processing apparatus, a method of manufacturing a semiconductor device and a non-transitory computer-readable recording medium.

BACKGROUND

According to some related arts, a substrate processing apparatus is provided with a groove such that the microwave supplied to a process space in which a substrate is processed is suppressed from being transmitted into a non-process space. For example, the groove is provided on a side wall of a substrate support or on an inner wall of a process vessel facing the side wall.

A process housing accommodating a process chamber is provided. The substrate is processed in the process chamber by supplying the microwave into the process chamber. A transfer housing accommodating a transfer chamber is provided next to the process housing. The substrate is transferred into the process chamber from the transfer chamber or transferred out of the process chamber into the transfer chamber. A loading/unloading port connecting the process chamber and the transfer chamber is provided, and an opening/closing structure configured to open or close the loading/unloading port is provided.

In such a configuration, the microwave leaking from the process chamber may be detected by detecting the microwave leaking through a joint between the process housing and the transfer housing.

SUMMARY

Described herein is a technique capable of preventing electronic components arranged inside a transfer chamber from malfunctioning or being damaged due to a microwave leakage into the transfer chamber.

According to one aspect of the technique of the present disclosure, there is provided a substrate processing apparatus including: a process housing including a process chamber in which a substrate is processed; a transfer housing provided adjacent to the process housing and comprising a transfer chamber wherein the substrate is transferred between the process chamber and the transfer chamber; a microwave generator configured to transmit a microwave to be supplied into the process chamber; a loading/unloading port connecting between the process chamber and the transfer chamber and through which the substrate is transferred; an opening/closing structure configured to open or close the loading/unloading port; and a detection sensor provided in the transfer chamber adjacent to the loading/unloading port and configured to detect the microwave leaking to the transfer chamber from the process chamber through the loading/unloading port while the opening/closing structure maintains the loading/unloading port closed.

DETAILED DESCRIPTION

Hereinafter, one or more embodiments (hereinafter, simply referred to as "embodiments") according to the technique of the present disclosure will be described.

First Embodiment

An example of a substrate processing apparatus, a method of manufacturing a semiconductor device and a non-transitory computer-readable recording medium according to the first embodiment described herein will be described with reference to FIGS. 1 through 8. In the figures, a direction indicated by an arrow H represents a height direction (a vertical direction) of the substrate processing apparatus, a direction indicated by an arrow W represents a width direction (a horizontal direction) of the substrate processing apparatus, and a direction indicated by an arrow D represents a depth direction (another horizontal direction) of the substrate processing apparatus. Hereinafter, the height direction, the width direction and the depth direction of the substrate processing apparatus may be simply referred to as an "apparatus height direction", an "apparatus width direction" and an "apparatus depth direction", respectively.

Configuration of Substrate Processing Apparatus 1

Figure 8:
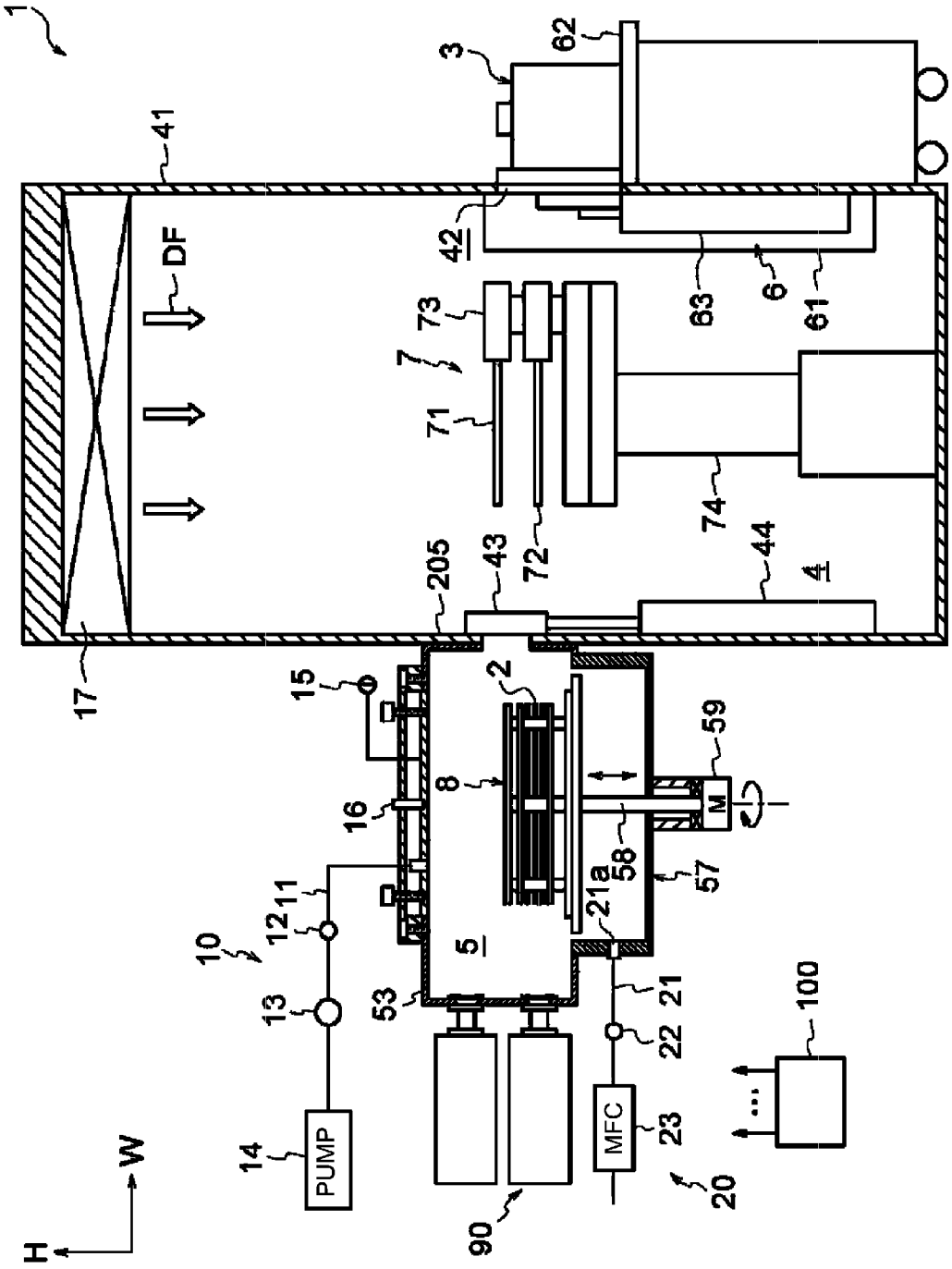
FIG. 8 schematically illustrates an overall configuration of the substrate processing apparatus according to the first embodiment described herein.

As shown in FIG. 8, a substrate processing apparatus 1 according to the present embodiment is configured as a heat treatment apparatus capable of performing various kinds of heat treatments on a semiconductor wafer (hereinafter, also simply referred to as a "wafer") 2 serving as a substrate or a plurality of wafers including the wafer 2. The present embodiment will be described by way of an example in which the substrate processing apparatus 1 is configured as an apparatus that performs an annealing process using a microwave (electromagnetic wave) such as a process of changing a composition and a crystal structure of a film formed on a surface of the wafer 2 and a process of recovering a crystal defect in the film. In the substrate processing apparatus 1, a FOUP (Front Opening Unified Pod, hereinafter, also simply referred to as a "pod") 3 serving as a storage vessel (carrier) is used. The pod 3 is also used as a transfer vessel. That is, the wafer 2 is transferred between various substrate processing apparatuses including the substrate processing apparatus 1 while the wafer 2 is accommodated in the pod 3.

Figure 5:
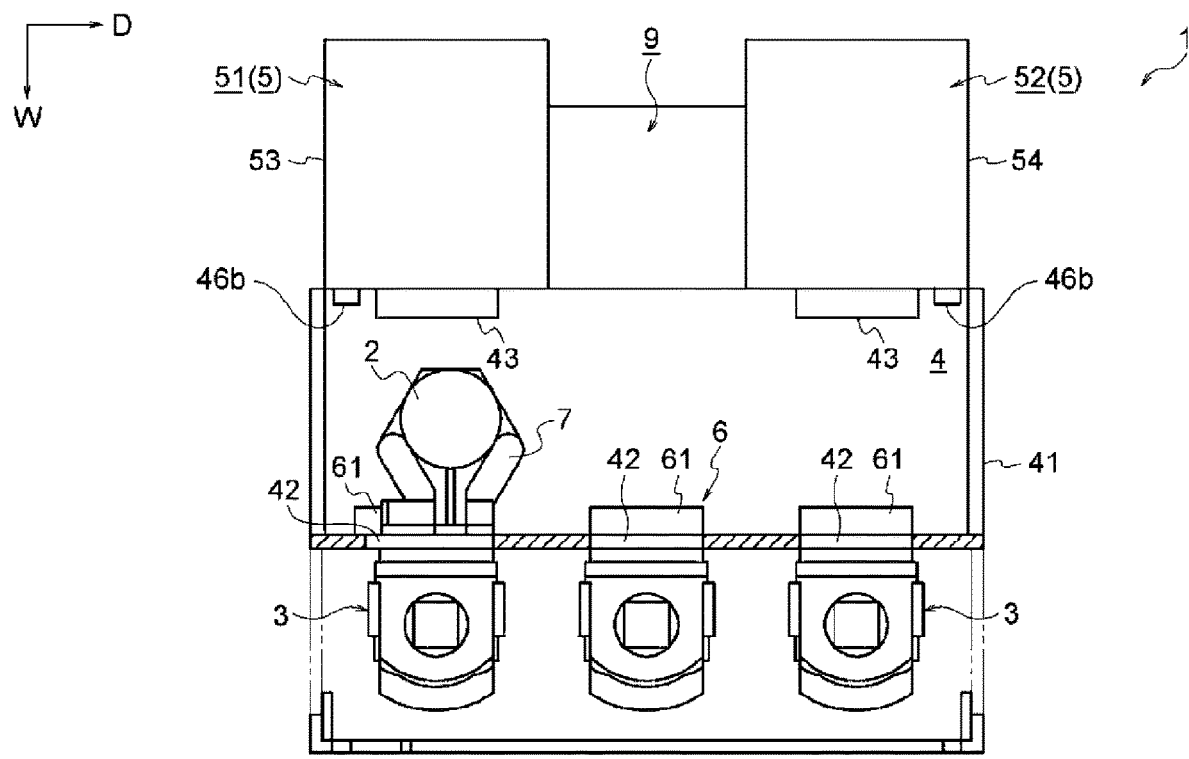
FIG. 5 is a cross-sectional view schematically illustrating components such as the process chamber, the transfer chamber and the cooling chamber of the substrate processing apparatus according the first embodiment described herein.

As shown in FIG. 8, the substrate processing apparatus 1 includes a transfer chamber (transfer region) 4 from/to which the wafer 2 is transferred and a process chamber 5 in which the wafer 2 is processed. The transfer chamber 4 is provided inside a transfer housing 41. According to the present embodiment, as shown in FIG. 5, the process chamber 5 includes two process chambers, that is, a first process chamber 51 and a second process chamber 52. The process chamber 5 is provided on a side wall of the transfer housing 41 opposite to the pod 3. The first process chamber 51 and the second process chamber 52 are provided inside a first process housing 53 and a second process housing 54, respectively. Hereinafter, the first process chamber 51 may be simply referred to as the process chamber 51, the second process chamber 52 may be simply referred to as the process chamber 52, the first process housing 53 may be simply referred to as the process housing 53 and the second process housing 54 may be simply referred to as the process housing 54. The process chamber 51 and the process chamber 52 are spaced apart from each other in the apparatus depth direction.

According to the present embodiment, for example, the transfer housing 41 of the transfer chamber 4 is made of a material such as quartz and a metal material such as aluminum (Al) and stainless steel (SUS).

As shown in FIG. 8, a loading port structure (LP) 6 is arranged on one side (right side in FIG. 8) of the transfer chamber 4 that faces toward the apparatus width direction. The loading port structure 6 is used as a pod opening/closing structure capable of opening and closing a lid of the pod 3, transferring the wafer 2 from the pod 3 to the transfer chamber 4 and transferring the wafer 2 from the transfer chamber 4 to the pod 3.

The loading port structure 6 includes a housing 61, a stage 62 and an opener 63. The stage 62 is configured such that the pod 3 is placed thereon and that the pod 3 is brought close to a substrate loading/unloading port 42 formed in the transfer chamber 4 on one side of the transfer housing 41 that faces toward the apparatus width direction. The opener 63 is configured to open and close the lid (not shown) provided on the pod 3.

The loading port structure 6 may be capable of purging an inside of the pod 3 using a purge gas. For example, an inert gas such as nitrogen ($N_2$) gas may be used as the purge gas.

Opening/closing structures (so-called gate valves) 43 capable of opening and closing the process chambers 51 and 52 (see FIG. 5) are arranged on the other side (left side in FIG. 8) of the transfer chamber 4 that faces toward the apparatus width direction. That is, an opening/closing structure capable of opening and closing the process chamber 51 and an opening/closing structure capable of opening and closing the process chamber 52 are provided as the opening/closing structures 43. In the present specification, the opening/closing structure capable of opening and closing the process chamber 51 may also be simply referred to as an opening/closing structure 43, and the opening/closing structure capable of opening and closing the process chamber 52 may also be simply referred to as an opening/closing structure 43. A transfer structure 7 serving as a substrate transfer structure (substrate transfer robot) of transferring the wafer 2 is arranged in the transfer chamber 4. For example, the transfer structure 7 is constituted by: tweezers (arms) 71 and 72 serving as mounting structures on which the wafer 2 is placed; a transfer device 73 capable of rotating or linearly moving each of the tweezers 71 and 72 in the horizontal direction; and a transfer device elevator 74 capable of elevating or lowering the transfer device 73.

The transfer structure 7 may load the wafer 2 into a boat 8 (see FIGS. 3 and 8) serving as a substrate retainer provided inside the process chamber 5 or may load the wafer 2 into the pod 3 by consecutive operations of the tweezers 71 and 72, the transfer device 73 and the transfer device elevator 74. In addition, the transfer structure 7 may unload the wafer 2 out of the boat 8 or may unload the wafer 2 out of the pod 3. In the description of the present embodiment, the process chamber 51 and the process chamber 52 may be collectively or individually referred to as the process chamber 5 unless they need to be distinguished separately.

Figure 4:
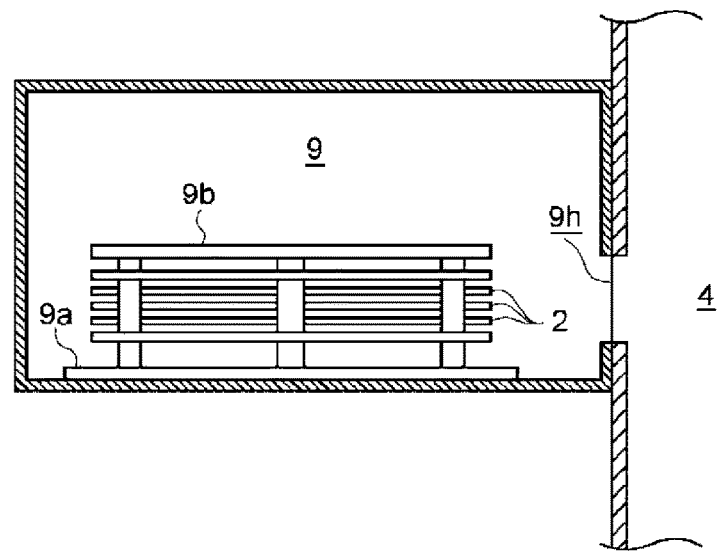
FIG. 4 is a cross-sectional view schematically illustrating components such as a cooling chamber of the substrate processing apparatus according the first embodiment described herein.

As shown in FIG. 5, a cooling chamber 9 is arranged between the process chamber 51 and the process chamber 52. As shown in FIG. 4, a wafer cooling table 9a is arranged in the cooling chamber 9, and a wafer cooling retainer (a cooling boat) 9b serving as a substrate cooling retainer configured to cool the wafer 2 is placed on the wafer cooling table 9a. A structure of the wafer cooling retainer 9b is similar to that of the boat 8. The wafer cooling retainer 9b is provided with a plurality of wafer supporting grooves (wafer supporting portions) from an upper portion to a lower portion thereof. The wafer cooling retainer 9b is configured to hold the plurality of the wafers including the wafer 2 vertically in a horizontal orientation in a multistage manner. A loading/unloading port 9h configured to communicate with the transfer chamber 4 is provided on a side wall of the cooling chamber 9 in contact with the transfer chamber 4. As described above, the cooling chamber 9 is arranged at a different location from the transfer chamber 4. Therefore, it is possible to cool the wafer 2 after a wafer processing (also referred to as a "substrate processing") without reducing the throughput of the wafer processing or a wafer transfer process.

Configuration of Process Chamber 5

As shown in FIGS. 5 and 8, the process chamber 5 is configured as a process furnace of the substrate processing apparatus 1. According to the present embodiment, a configuration of the process chamber 51 is substantially the same as that of the process chamber 52. Therefore, the process chamber 51 will be described below, and the description of the process chamber 52 will be omitted.

Figure 3:
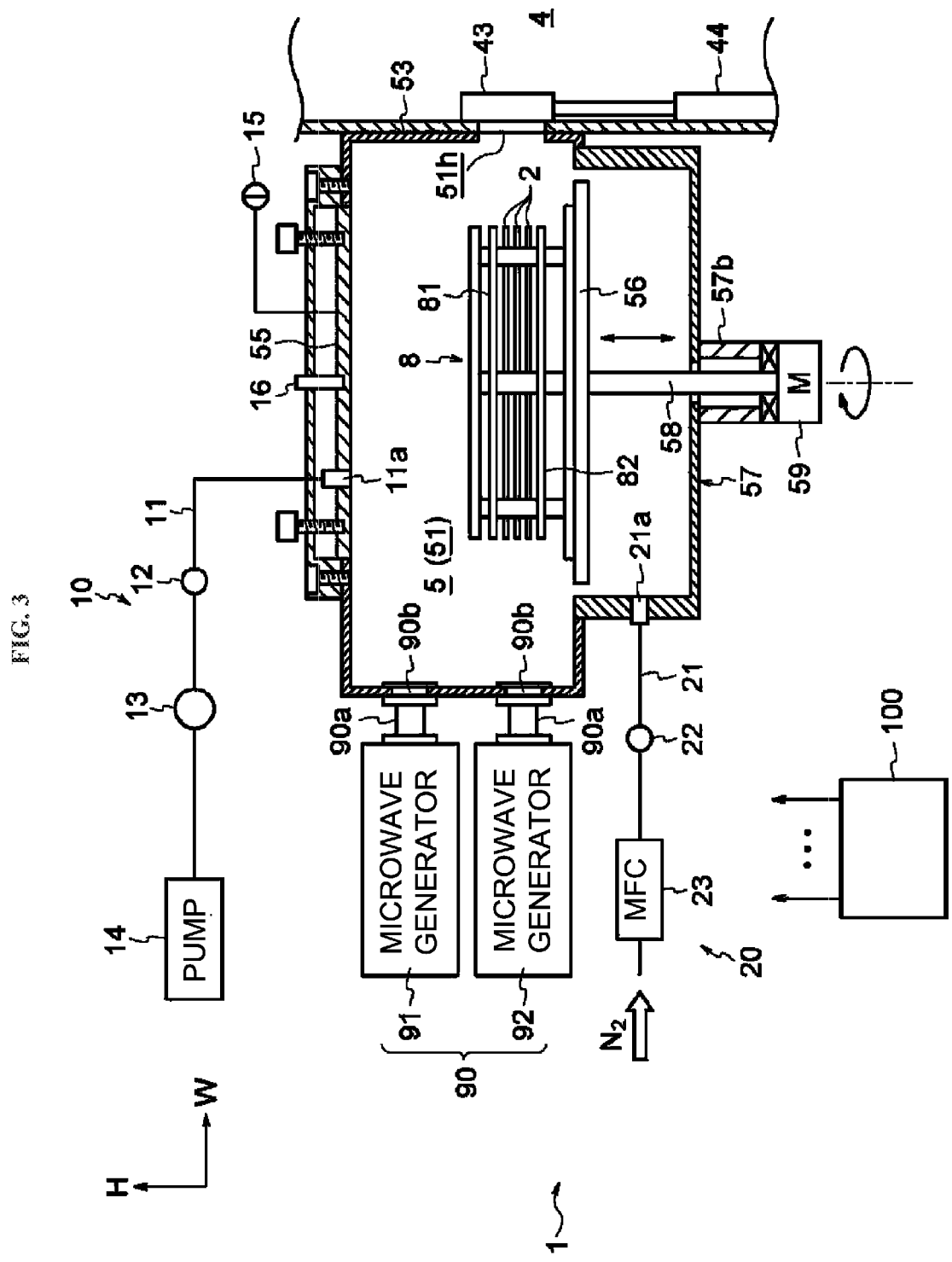
FIG. 3 is a cross-sectional view schematically illustrating a process chamber and its peripheral structure of the substrate processing apparatus according the first embodiment described herein.

As shown in FIG. 3, the process chamber 51 is provided inside the process housing 53 of a hollow rectangular parallelepiped shape serving as a cavity (process vessel). For example, the process housing 53 is made of a metal material such as aluminum (Al) capable of reflecting the microwave.

A cap flange (which is a closing plate) 55 is provided on a ceiling (upper portion) of the process housing 53. For example, the cap flange 55 is made of a metal material similar to the process housing 53. The cap flange 55 is attached to the process housing 53 with a seal (sealing structure: not shown) interposed therebetween to airtightly seal the process chamber 5. The wafer 2 is processed in the process chamber 5. For example, an O-ring is used as the seal.

A reaction tube (not shown) made of quartz capable of transmitting the microwave may be provided in the process housing 53. When the reaction tube is provided in the process housing 53, an inner space of the reaction tube is used as an effective process chamber 51. In addition, the process housing 53 may not include the cap flange 55. When the cap flange 55 is not included, the process housing 53 with a closed ceiling may be used.

A standby region 57 is provided at the bottom of the process chamber 51. A mounting table 56 capable of moving in the process chamber 51 in the vertical direction is provided inside the standby region 57. The boat 8 is placed on an upper surface of the mounting table 56. For example, a quartz boat is used as the boat 8. The boat 8 is provided with susceptors 81 and 82 that are vertically separated and opposed to each other. The wafer 2 loaded into the process chamber 51 through a loading/unloading port 51h is held by the boat 8 while the wafer 2 is interposed between the susceptor 81 and the susceptor 82.

The susceptors 81 and 82 are configured to indirectly heat the wafer 2 made of a dielectric material capable of self-heating (that is, generating heat) by absorbing the microwave. For example, a silicon semiconductor plate (also referred to as a "Si plate") or a silicon carbide plate (also referred to as a "SiC plate") may be used as the susceptors 81 and 82. Therefore, the susceptors 81 and 82 may also be referred to as an "energy conversion structure", a "radiant plate" or a "soaking plate". In particular, the number of wafers to be held in the boat 8 is not limited. However, for example, the boat 8 is capable of holding three wafers including the wafer 2 stacked in the vertical direction with predetermined intervals therebetween. When the susceptors 81 and 82 are provided, it is possible to heat the wafer 2 (or the plurality of wafers including the wafer 2) more uniformly and more efficiently by the radiant heat from the susceptors 81 and 82.

Quartz plates serving as heat insulating plates may be arranged in the boat 8 above the susceptor 81 and below the susceptor 82, respectively. The process chamber 5 is arranged adjacent to the transfer chamber 4 in the horizontal direction. However, the process chamber 5 may be arranged adjacent to the transfer chamber 4 in a direction perpendicular to the transfer chamber 4, specifically, above or below the transfer chamber 4.

As shown in FIGS. 3, 5 and 8, in the process chamber 5 (that is, the process chamber 51), the loading/unloading port 51h configured to communicate with the transfer chamber 4 is provided on a side wall of the process chamber 5 in contact with the transfer chamber 4. The wafer 2 is loaded into the process chamber 5 from the transfer chamber 4 through the loading/unloading port 51h, and is unloaded to the transfer chamber 4 out of the process chamber 5 through the loading/unloading port 51h. A choke structure (not shown) whose length is of ¼ wavelength of the microwave used in a substrate processing such as the annealing process is provided around the opening/closing structure 43 or the loading/unloading port 51h. The choke structure is configured as a measure against a microwave leakage. In the process chamber 5 (that is, the process chamber 52), a loading/unloading port 52h configured to communicate with the transfer chamber 4 is provided on the side wall of the process chamber 5 in contact with the transfer chamber 4 (see FIG. 1).

Figure 1:
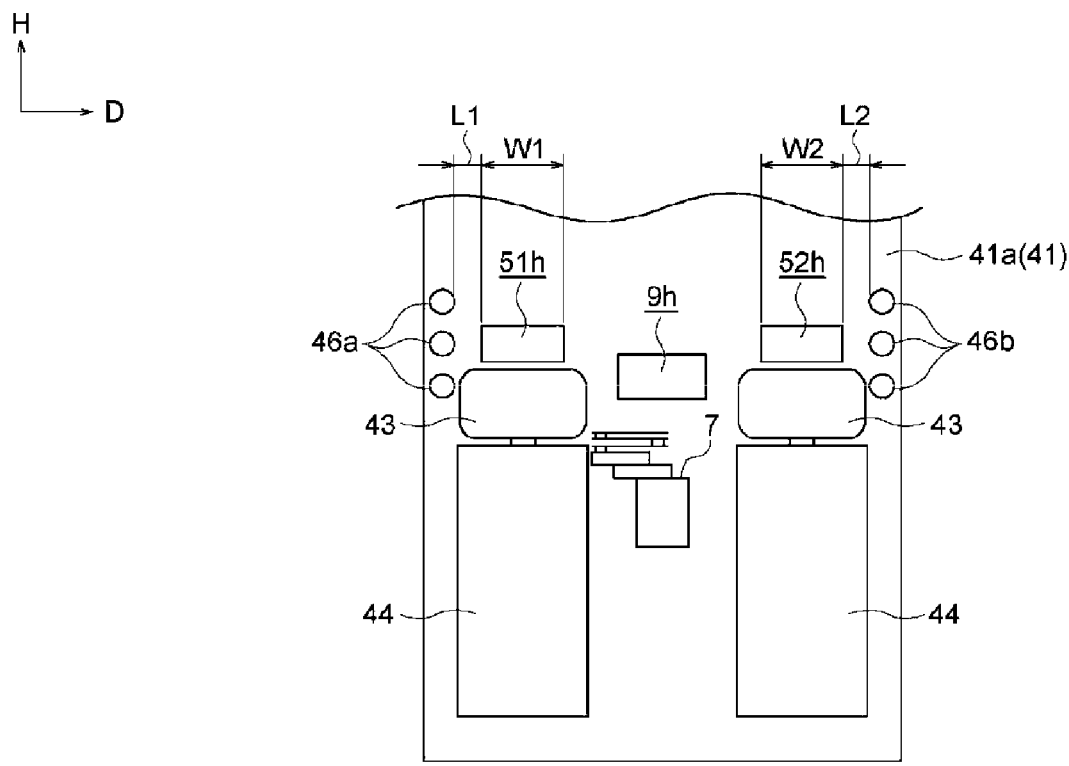
FIG. 1 schematically illustrates a substrate processing apparatus according a first embodiment described herein when viewed from an inside of a transfer chamber thereof toward a loading/unloading port of thereof.
Figure 2:
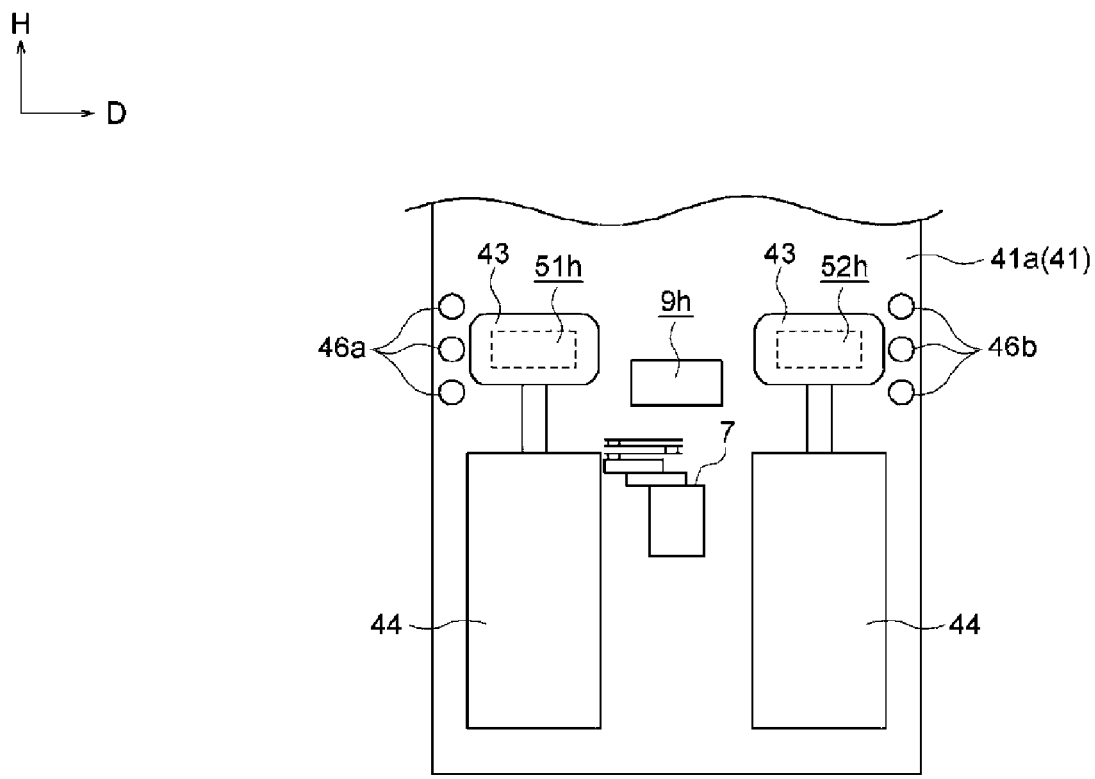
FIG. 2 schematically illustrates the substrate processing apparatus according the first embodiment described herein when viewed from the inside of the transfer chamber toward the loading/unloading port.

As shown in FIGS. 1 and 2, vertical driving structures 44 capable of moving each of the opening/closing structures 43 up and down are arranged below the opening/closing structures 43, respectively. As a result, the vertical driving structures 44 are configured to open and close the loading/unloading ports 51h and 52h by moving the opening/closing structures 43 up and down, respectively.

In addition, a plurality of detection sensors (first detection sensors, for example, three detection sensors) 46a and a plurality of detection sensors (second detection sensors, for example, three detection sensors) 46b, which are configured to detect the microwave leaking to the transfer chamber 4 from the process chambers 51 and 52 through the loading/unloading ports 51h and 52h while the opening/closing structures 43 maintain the loading/unloading ports 51h and 52h closed, are installed in the transfer chamber 4 around the loading/unloading ports 51h and 52h, respectively. In the present specification, the plurality of the detection sensors 46a may be simply referred to as the detection sensors 46a and the plurality of the detection sensors 46b may be simply referred to as the detection sensors 46b. Specifically, the detection sensors 46a and the detection sensors 46b are attached to an inner wall 41a of the transfer housing 41. The loading/unloading ports 51h and 52h are provided on the inner wall 41a. The detection sensors 46a are arranged outside the loading/unloading port 51h (that is, for example, on a left side wall of the transfer housing 41 opposite to the loading/unloading port 52h and located on the left side of FIGS. 1, 2 and 5), and the detection sensors 46b are arranged outside the loading/unloading port 52h (that is, for example, on a right side wall of the transfer housing 41 opposite to the loading/unloading port 51h and located on the right side of FIGS. 1, 2, and 5). That is, the detection sensors 46a are arranged at positions away from the loading/unloading port 52h of the second process chamber 52 (that is, at positions beyond the reach of the microwave leaking through the loading/unloading port 52h), and the detection sensors 46b are arranged at positions away from the loading/unloading port 51h of the first process chamber 51 (that is, at positions beyond the reach of the microwave leaking through the loading/unloading port 51h). By arranging the detection sensors 46a and the detection sensors 46b at such positions, it is possible to prevent the detection sensors 46a from erroneously detecting the microwave leaking through the loading/unloading port 52h of the second process chamber 52 and it is also possible to prevent the detection sensors 46b from erroneously detecting the microwave leaking through the loading/unloading port 51h of the first process chamber 51.

In the present embodiment, by comparing an opening width and an opening height of each of the loading/unloading ports 51h and 52h, the longer between the opening width and the opening height is defined as a distance K1. Then, the term "in the transfer chamber 4 around the loading/unloading ports 51h and 52h" refers to a region whose distance from opening edges of the loading/unloading ports 51h and 52h is within the distance K1 when viewed from an opening direction in which the loading/unloading ports 51h and 52h open.

According to the present embodiment, the detection sensors (for example, three detection sensors) 46a are provided as sensors configured to detect the microwave leaking through the loading/unloading port 51h. The detection sensors 46a are arranged opposite to the loading/unloading port 52h with reference to the loading/unloading port 51h when viewed from the opening direction in which the loading/unloading port 51h is open (in the present embodiment, the apparatus width direction), and are arranged vertically. In addition, a range within which the detection sensors 46a are arranged in the vertical direction covers an opening area of the loading/unloading port 51h. Further, a distance between each of the detection sensors 46a and the loading/unloading port 51h (L1 in FIG. 1) along the apparatus depth direction is set to be equal to or less than the opening width of the loading/unloading port 51h (W1 in FIG. 1).

From the viewpoint of improving the detection accuracy by the detection sensors 46a, the distance L1 between each of the detection sensors 46a and the loading/unloading port 51h is preferably equal to or less than half the opening width W1 of the loading/unloading port 51h, more preferably equal to or less than 40% of the opening width W1 of the loading/unloading port 51h, and still more preferably equal to or less than 20% of the opening width W1 of the loading/unloading port 51h.

According to the present embodiment, the detection sensors (for example, three detection sensors) 46b are provided as sensors configured to detect the microwave leaking through the loading/unloading port 52h. The detection sensors 46b are arranged opposite to the loading/unloading port 51h with reference to the loading/unloading port 52h when viewed from the opening direction in which the loading/unloading port 52h is open, and are arranged vertically. In addition, a range within which the detection sensors 46b are arranged in the vertical direction covers an opening area of the loading/unloading port 52h is open. Further, a distance between each of the detection sensors 46b and the loading/unloading port 52h (L2 in FIG. 1) along the apparatus depth direction is set to be equal to or less than the opening width of the loading/unloading port 52h (W2 in FIG. 1).

From the viewpoint of improving the detection accuracy of the detection sensors 46b, the distance L2 between each of the detection sensors 46b and the loading/unloading port 52h is preferably equal to or less than half the opening width W2 of the loading/unloading port 52h, more preferably equal to or less than 40% of the opening width W2 of the loading/unloading port 52h, and still more preferably equal to or less than 20% of the opening width W2 of the loading/unloading port 52h.

As shown in FIG. 3, an electromagnetic wave supplier (which is an electromagnetic wave supply system) 90 serving as a heating apparatus is arranged on a side wall of the process housing 53 opposite to the transfer chamber 4. According to the present embodiment, for example, the electromagnetic wave supplier 90 is constituted by a microwave generator 91 and a microwave generator 92. Specifically, the microwave generators 91 and 92 are arranged so as to face the loading/unloading ports 51h and 52h with the process chamber 5 interposed therebetween. The microwave transmitted from the microwave generators 91 and 92 are supplied to the process chamber 5 to heat the wafer 2 and perform various processes on the wafer 2.

The mounting table 56 on which the boat 8 is placed is connected to and supported by an upper end of a shaft 58 serving as a rotating shaft at a center portion of a lower surface of the mounting table 56. The other end of the shaft 58 penetrates the bottom of the process housing 53 (that is, the bottom of the standby region 57), and is connected to a driving structure 59 arranged on a lower portion of the process housing 53. According to the present embodiment, an electric motor and an elevating apparatus are used as the driving structure 59. The other end of the shaft 58 is connected to a rotating shaft of the electric motor. Since the shaft 58 is connected to the driving structure 59, by rotating the shaft 58 by the driving structure 59, the mounting table 56 and the wafer 2 accommodated in the boat 8 are rotated.

A bellows 57b capable of expanding and contracting in the vertical direction covers an outer circumference of the shaft 58 from the bottom of the standby region 57 to the driving structure 59. The bellows 57b is configured to maintain the inside of the process chamber 5 and the inside of the transfer region 4 airtight.

The driving structure 59 is configured so that the mounting table 56 can be elevated and lowered in the vertical direction. That is, the driving structure 59 is configured to elevate the boat 8 from a position at which the wafer 2 is accommodated in the standby region 57 to a position (which is a wafer processing position) at which the wafer 2 is accommodated in the process chamber 5. On the contrary, the driving structure 59 is configured to lower the boat 8 from the position at which the wafer 2 is accommodated in the process chamber 5 to the position at which the wafer 2 is accommodated in the standby region 57.

Configuration of Exhauster 10

As shown in FIGS. 3 and 8, an exhauster (which is an exhaust structure or an exhaust system) 10 is provided at an upper portion of the process chamber 5 in the substrate processing apparatus 1 according to the present embodiment. The exhauster 10 is configured to exhaust an inner atmosphere of the process chamber 5. As shown briefly in FIG. 3, the exhauster 10 includes an exhaust port 11a provided on a ceiling of the process chamber 5. The exhaust port 11a is connected to one end of an exhaust pipe 11.

As shown in FIG. 3, a valve 12 and a pressure regulator (which is an automatic pressure adjusting valve) 13 are sequentially installed in series and connected to a vacuum pump 14. The valve 12 is used as an opening/closing valve. For example, as the automatic pressure adjusting valve 13, an automatic pressure control (APC) valve configured to control a valve opening degree according to an inner pressure of the process chamber 5 may be used. In the description of the present embodiment, the exhauster 10 may be described simply as the "exhaust system" or simply an "exhaust line".

Configuration of Gas Introducer 20

As shown in FIG. 3, in the substrate processing apparatus 1, a gas introducer (which is a gas introduction structure or a gas introduction system) 20 is provided at a lower portion of the process chamber 5. Specifically, the gas introducer 20 includes a supply pipe 21 whose one end is connected to a supply port 21a arranged on the side wall of the process chamber 5 opposite to the transfer chamber 4. The supply port 21a is arranged below the exhaust port 11a of the exhaust pipe 11. The other end of the supply pipe 21 is connected to a gas supply source (not shown) through a valve 22 and a mass flow controller (MFC) 23 interposed therebetween in series. For example, the valve 22 is used as an opening/closing valve. The MFC 23 functions as a flow rate controller. The gas supply source is configured to supply a process gas used for the substrate processing. A gas such as an inert gas, a source gas and a reactive gas may be used as the process gas. The process gas supplied from the gas supply source is supplied into the process chamber 5. According to the present embodiment, as the inert gas, specifically, nitrogen gas is supplied from the gas supply source into the process chamber 5.

When two or more kinds of gases are supplied into the process chamber 5 during the substrate processing, it is possible to supply the gases by connecting a supply pipe (or a plurality of gas supply pipes) to the supply pipe 21 between the process chamber 5 and the valve 22 shown in FIG. 3. The supply pipe (or the plurality of the gas supply pipes) may be connected to a gas supply source (or a plurality of gas supply sources: not shown) configured to supply the two or more kinds of gases through a valve (or valves) and an MFC (or MFCs) interposed therebetween in series from a downstream side (or downstream sides) to an upstream side (or upstream sides) of the supply pipe (or the plurality of the gas supply pipes).

According to the present embodiment, the gas introducer 20 is constituted by the supply pipe 21, the valve 22 and the MFC 23 shown in FIG. 3. The gas introducer 20 may further include the gas supply source (not shown).

Instead of the nitrogen gas, a rare gas such as argon (Ar) gas, helium (He) gas, neon (Ne) gas, and xenon (Xe) gas may be used as the inert gas supplied through the gas introducer 20.

Configuration of Temperature Meter 16

As shown in FIG. 3, the ceiling of the process chamber 5 is sealed by the cap flange 55, and a temperature meter (which is a temperature measuring structure) 16 is arranged on the cap flange 55. A non-contact type temperature sensor may be used as the temperature meter 16. The temperature meter 16 is configured to generate temperature information of an inner temperature of the process chamber 5 by measuring the inner temperature of the process chamber 5, and a flow rate of a cooling gas introduced through the gas introducer 20 may be adjusted based on the temperature information of the inner temperature of the process chamber 5. In addition, the temperature meter 16 is configured to generate temperature information of the wafer 2 by measuring a temperature of the wafer 2, and parameters such as an output of the electromagnetic wave supplier 90 may be adjusted based on the temperature information of the wafer 2. As a result, a heating temperature of the wafer 2 is adjusted, and a temperature distribution in the process chamber 5 (that is, a temperature distribution of the wafer 2) is optimized. As the temperature sensor serving as the temperature meter 16, for example, a radiation thermometer (IR: infrared radiation) may be practically used. A surface temperature of the wafer 2 is measured by the radiation thermometer. When the boat 8 is provided with the susceptor 81, a surface temperature of the susceptor 81 is measured by the radiation thermometer.

In the description of the present embodiment, the term "temperature of the wafer 2" (or wafer temperature) may indicate a wafer temperature converted by temperature conversion data (that is, an estimated wafer temperature), or may indicate a temperature obtained directly by measuring the temperature of the wafer 2 by the temperature meter 16, or may indicate both of them.

Figure 7:
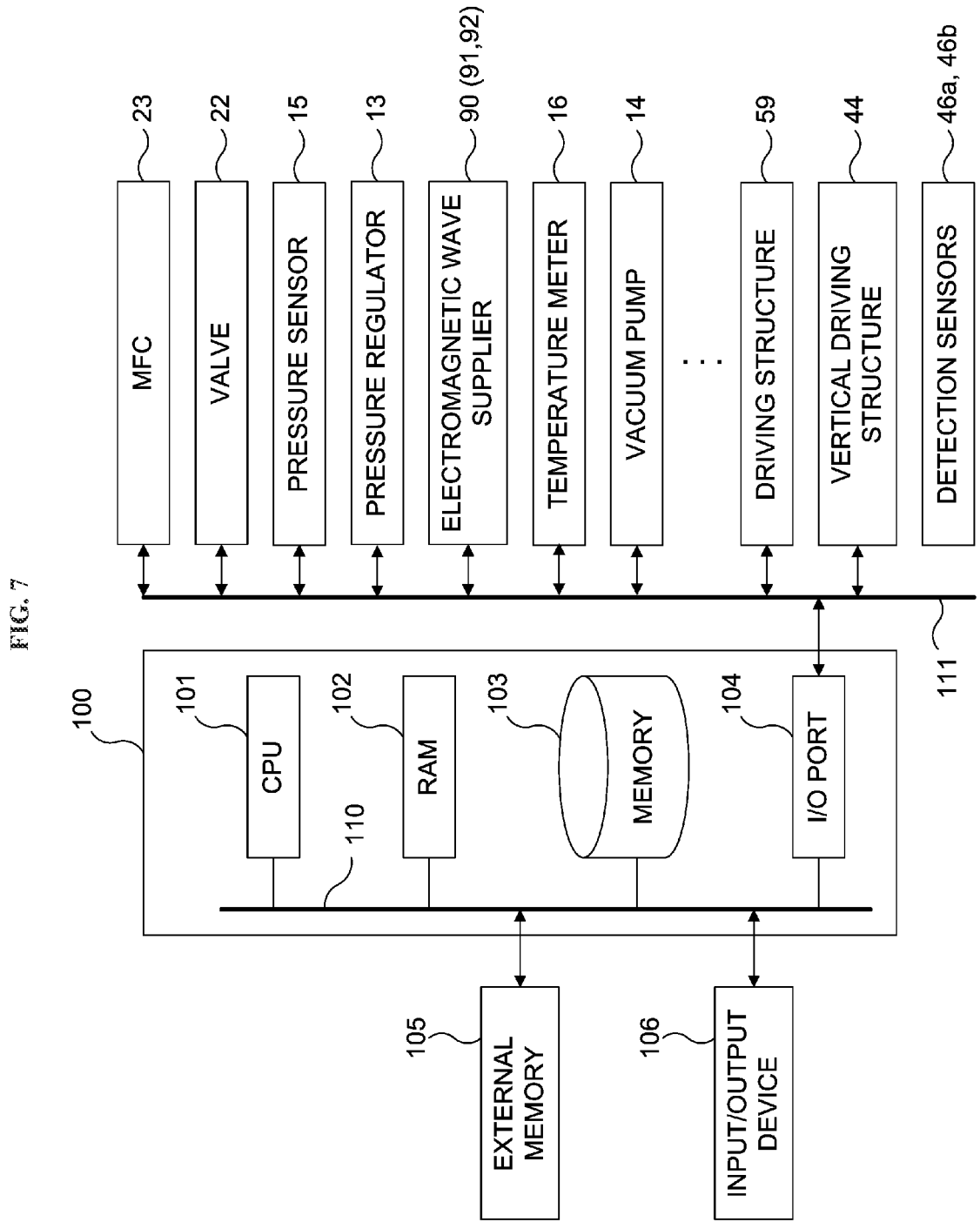
FIG. 7 is a block diagram schematically illustrating a configuration of a controller and related components of the substrate processing apparatus according to the first embodiment described herein.

The temperature conversion data may be stored in advance in a memory 103 of a controller 100 or may be stored in an external memory 105 provided outside the controller 100 shown in FIG. 7. By acquiring the transition of the temperature change for each of the susceptor 81 and the wafer 2 shown in FIG. 3 and deriving a correlation between the temperature of the susceptor 81 and the temperature of the wafer 2 from the transition of the temperature change, the temperature conversion data may be obtained.

By preparing the temperature conversion data in advance as described above, it is possible to estimate the temperature of the wafer 2 by measuring the temperature of the susceptor 81. It is also possible to control the output of the electromagnetic wave supplier 90 to control a process temperature based on the estimated temperature of the wafer 2.

While the present embodiment is described by way of an example in which the radiation thermometer described above is used as the temperature meter 16, the present embodiment is not limited thereto. For example, a thermocouple may be used as the temperature meter 16 to measure the temperature of the wafer 2, or both the thermocouple and the temperature sensor (non-contact type thermometer) may be used as the temperature meter 16 to measure the temperature of the wafer 2. However, when the thermocouple is used as the temperature meter 16, the thermocouple is disposed in the vicinity of the wafer 2 to measure the temperature the wafer 2. Therefore, the thermocouple itself is heated by the microwave supplied from the electromagnetic wave supplier 90. As a result, it is difficult to accurately measure the temperature of the wafer 2. Therefore, it is preferable to use the non-contact type thermometer as the temperature meter 16.

While the present embodiment is described by way of an example in which the temperature meter 16 is provided at the cap flange 55, the present embodiment is not limited thereto. For example, the temperature meter 16 may be provided at the mounting table 56. For example, instead of directly providing the temperature meter 16 at the cap flange 55 or the mounting table 56, the temperature meter 16 may measure the temperature of the wafer 2 indirectly by measuring the radiation light reflected by the components such as a mirror and emitted through a measurement window provided in the cap flange 55 or the mounting table 56. While the present embodiment is described by way of an example in which one temperature meter 16 is provided in the process chamber 5, the present embodiment is not limited thereto. For example, a plurality of temperature meters may be provided in the process chamber 5.

Configuration of Electromagnetic Wave Supplier 90

As shown in FIG. 3, electromagnetic wave introduction ports 90b that penetrate from inside to outside of the process chamber 5 (that is, the process chamber 51) is arranged on the side wall of the process housing 53 opposite to the transfer chamber 4. According to the present embodiment, for example, two electromagnetic wave introduction ports 90b are arranged in the vertical direction and two electromagnetic wave introduction ports 90b are arranged in the horizontal direction. That is, a total of four electromagnetic wave introduction ports 90b are arranged (only two are shown in FIG. 3). Each of the electromagnetic wave introduction ports 90b is of a rectangular shape whose longitudinal direction is a left-right direction when viewed from the transfer chamber 4 toward the process chamber 5. The number and the shape of the electromagnetic wave introduction ports 90b are not particularly limited.

One end of each of waveguides 90a is connected to each of the electromagnetic wave introduction ports 90b, and the other end of each of the waveguides 90a is connected to the electromagnetic wave supplier 90. According to the present embodiment, the microwave generators 91 and 92 are used as the electromagnetic wave supplier 90. The microwave generator 91 arranged on the upper portion of the process chamber 5 is connected to the electromagnetic wave introduction ports 90b through an upper one of the waveguides 90a. The microwave transmitted by the microwave generator 91 is supplied into the process chamber 5 through the upper one of the waveguides 90a and the electromagnetic wave introduction ports 90b. The microwave generator 92 arranged on the lower portion of the process chamber 5 is connected to the electromagnetic wave introduction ports 90b through a lower one of the waveguides 90a. The microwave transmitted by the microwave generator 92 is supplied into the process chamber 5 through the lower one of the waveguides 90a and the electromagnetic wave introduction ports 90b.

For example, a magnetron or a klystron may be used as the microwave generators 91 and 92. Preferably, a frequency of the microwave generated by each of the microwave generators 91 and 92 is controlled such that the frequency is within a range from 13.56 MHz to 24.125 GHz. More preferably, the frequency is controlled to a frequency of 2.45 GHz or less or a frequency of 5.8 GHz or less.

While the present embodiment is described by way of an example in which the frequency of the microwave generated by the microwave generator 91 is equal to the frequency of the microwave generated by the microwave generator 92, the present embodiment is not limited thereto. For example, the frequency of the microwave generated by the microwave generator 91 may be different from the frequency of the microwave generated by the microwave generator 92. In addition, the electromagnetic wave supplier 90 may include one microwave generator for the process chamber 5, or may include two, three or equal to or more than five microwave generators for the process chamber 5. For example, the microwave generator 91 may be arranged on the side wall of the process chamber 5, and the microwave generator 92 may be arranged on another side wall of the process chamber 5 facing the side wall of the process chamber 5 on which the microwave generator 91 is arranged. As shown in FIGS. 3 and 8, the electromagnetic wave supplier 90 is connected to the controller 100 serving as a control apparatus. Specifically, as shown in FIG. 7, the electromagnetic wave supplier 90 (that is, the microwave generators 91 and 92) is connected to the controller 100, and the controller 100 is connected to the temperature meter 16. When the temperature of the wafer 2 (that is, the inner temperature of the process chamber 5) is measured by the temperature meter 16 in the process chamber 5, the measured inner temperature is transmitted to the controller 100 as the temperature information. The controller 100 is configured to control the outputs of the microwave generators 91 and 92 based on the temperature information, and is configured to control the heating temperature of the wafer 2 (the process temperature of the wafer 2).

In order to control the outputs of the microwave generators 91 and 92, for example, a voltage input level of each of the microwave generators 91 and 92 may be adjusted or a voltage input duration (that is, a ratio of the power ON time and the power OFF time) of each of the microwave generators 91 and 92 may be adjusted. According to the present embodiment, the microwave generators 91 and 92 are controlled by the same control signal transmitted from the controller 100. However, the present embodiment is not limited thereto. For example, the microwave generator 91 and the microwave generator 92 may be individually controlled by individual control signals transmitted from the controller 100 to the microwave generator 91 and the microwave generator 92, respectively.

Configuration of Controller 100

As shown in FIG. 7, the controller 100 is constituted by a central processing unit (CPU) 101, a random access memory (RAM) 102, the memory 103 and an input/output (I/O) port 104. That is, the controller 100 is configured as a computer. In the description of the present embodiment, the central processing unit 101 is simply referred to as the CPU 101, the random access memory 102 is simply referred to as the RAM 102, and the input/output port 104 is simply referred to as the I/O port 104.

The CPU 101 is connected to each of the RAM 102, the memory 103 and the I/O port 104 through an internal bus 110, and is configured to exchange (that is, transmit or receive) various information with each of the RAM 102, the memory 103 and the I/O port 104. An input/output device 106 is connected to the controller 100 through the internal bus 110. As the input/output device 106, a component such as a touch panel, a keyboard and a mouse may be used. As the memory 103, for example, a component such as a flash memory and a hard disk drive (HDD) may be used.

For example, a control program for controlling the operation of the substrate processing apparatus 1 and a process recipe containing information on the sequences and the conditions of the annealing process (modification process) of the substrate processing are readably stored in the memory 103. The process recipe is obtained by combining steps of the substrate processing such that the controller 100 can execute the steps to acquire a predetermine result, and functions as a program (software).

In the description of the present embodiment, the control program and the process recipe may be collectively or individually referred to as a "program". The process recipe may be simply referred to as a "recipe". In the present specification, the term "program" may indicate only the recipe, may indicate only the control program, or may indicate both of the recipe and the control program. The RAM 102 functions as a memory area (work area) where a program or data read by the CPU 101 is temporarily stored.

The I/O port 104 is connected to the above-described components such as the MFC 23, the valve 22, a pressure sensor 15, the pressure regulator 13, the electromagnetic wave supplier 90, the temperature meter 16, the vacuum pump 14, the vertical driving structures 44, the driving structure 59, the detection sensors 46a and the detection sensors 46b. An external bus 111 is used to connect the I/O port 104 to the components described above.

The CPU 101 of the controller 100 is configured to read a control program from the memory 103 and execute the read control program. Furthermore, the CPU 101 is configured to read a recipe from the memory 103 according to an operation command inputted from the input/output device 106.

According to the contents of the read recipe, the CPU 101 may be configured to control various operations such as a flow rate adjusting operation for various gases by the MFC 23, an opening/closing operation of the valve 22, a pressure adjusting operation by the pressure regulator 13 based on the pressure sensor 15, a start and stop of the vacuum pump 14. The CPU 101 may be configured to further control an output adjusting operation by the electromagnetic wave supplier 90 based on the temperature meter 16. In addition, the CPU 101 may be configured to further control various operations such as a rotating operation, a rotation speed adjusting rotation and an elevating and lowering operation of the mounting table 56 (or the boat 8) by the driving structure 59.

The program stored in the external memory 105 is installed in the controller 100. As the external memory 105, for example, a magnetic disk such as a hard disk, an optical disk such as a magneto-optical (MO) disk or a compact disk (CD) may be used. In addition, as the external memory 105, a semiconductor memory such as a universal serial bus (USB) memory may be used.

The memory 103 or the external memory 105 may be embodied by a non-transitory computer readable recording medium (or a non-transitory computer readable-and-writable recording medium) in which the program and the data are stored readable or writable. Hereafter, the memory 103 or the external memory 105 are collectively or individually referred to as recording media. In the description of the present embodiment, the term "recording medium" may indicate only the memory 103, may indicate only the external memory 105 or may indicate both of the memory 103 or the external memory 105. Instead of using the memory 103 or the external memory 105, a communication means such as the Internet and a dedicated line may be used to provide the program to the controller 100.

Substrate Processing

Figure 6:
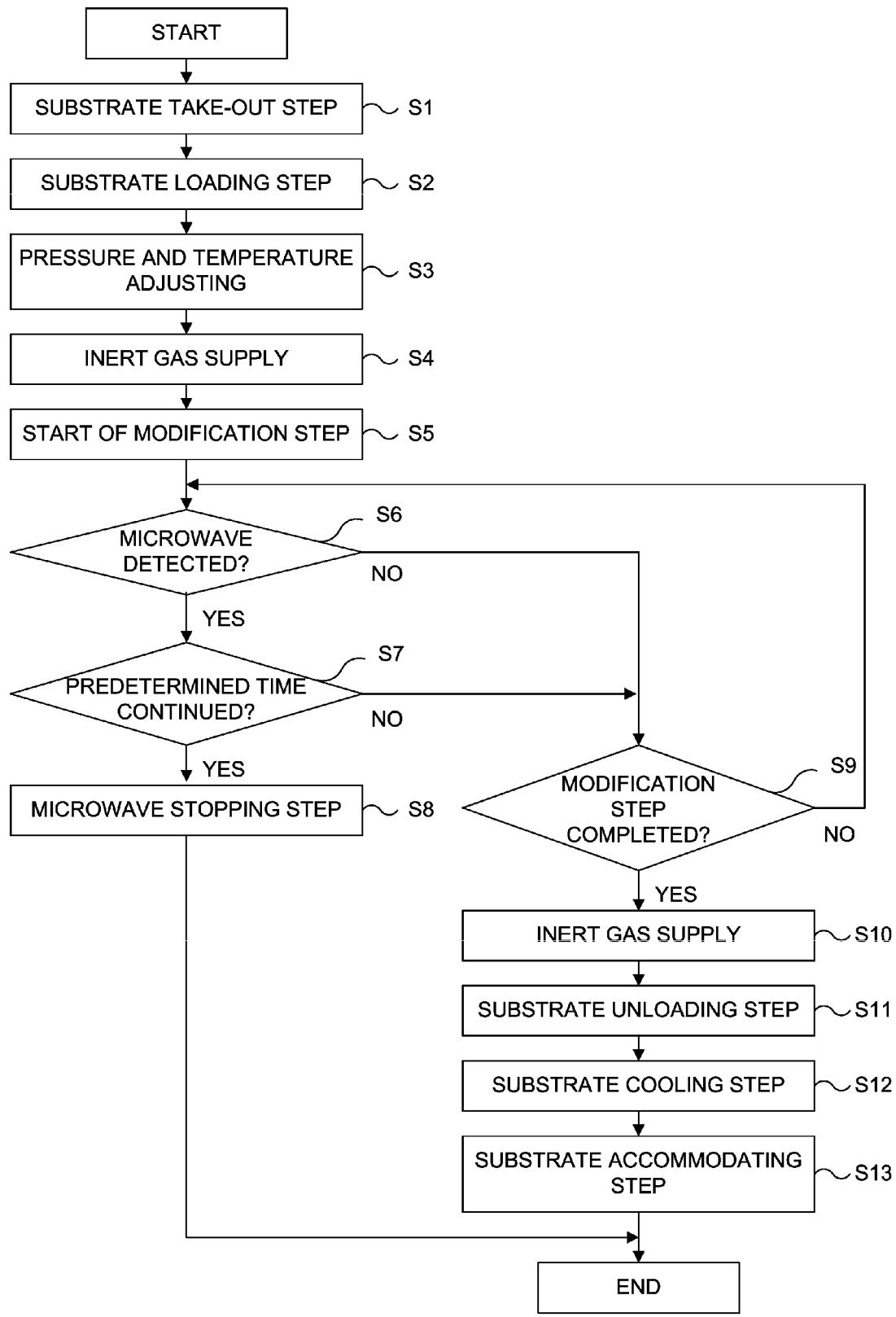
FIG. 6 is a flow chart schematically illustrating step of a substrate processing of the substrate processing apparatus according the first embodiment described herein.

Subsequently, the substrate processing performed by the substrate processing apparatus 1 will be described using FIG. 6 with reference to FIGS. 1 through 5. As the substrate processing according to the present embodiment, for example, a method (crystallization method) of modifying an amorphous silicon film formed on the wafer (substrate) 2, which is a part of manufacturing processes of the semiconductor device, will be described. In the substrate processing, the operations of the components of the substrate processing apparatus 1 shown in FIG. 8 are controlled by the controller 100 shown in FIG. 7. Since the same processing is performed in each of the process chambers 51 and 52 of the substrate processing apparatus 1 based on the same recipe, the processing using the process chamber 51 will be described, and the processing using the process chamber 52 will be omitted.

In the description of the present embodiment, the term "wafer 2" may refer to "the wafer 2 itself" or may refer to "the wafer 2 with a predetermined film (or stacked films) formed on the surface thereof". In addition, "the surface of the wafer 2" may refer to "the surface of the wafer 2 itself" or may refer to "a surface of the predetermined film (or stacked films) formed on the wafer 2". Thus, in the description of the present embodiment, "forming a predetermined layer on the surface of the wafer 2" may refer to "forming the predetermined layer on the surface of the wafer 2 itself" or may refer to "forming the predetermined layer on the surface of the predetermined film (or stacked films) formed on the wafer 2". In the description of the present embodiment, "substrate" and "the wafer 2" may be used as substantially the same meaning.

(1) Substrate Take-Out Step (Step S1)

The transfer structure 7 in the transfer chamber 4 of the substrate processing apparatus 1 shown in FIG. 8 takes out a predetermined number of wafers including the wafer 2 to be processed are taken out of the pod 3 opened by the loading port structure 6. Then, the predetermined number of the wafers including the wafer 2 are placed on one or both of the tweezers 71 and 72.

(2) Substrate Loading Step (Step S2)

The wafer 2 placed on one of the tweezers 71 and 72 (or the predetermined number of the wafers including the wafer 200 placed on both of the tweezers 71 and 72) is transferred (loaded) into the process chamber 51 while the loading/unloading port 51h is opened by an opening/closing operation of the opening/closing structure 43 shown in FIGS. 3 and 8 (wafer loading). After the wafer 2 is loaded into the process chamber 51, the loading/unloading port 51h is closed by the opening/closing operation of the opening/closing structure 43.

(3) Pressure and Temperature Adjusting (S3)

Subsequently, an inner pressure of the process chamber 51 (also referred to as an "inner pressure of a furnace") is adjusted to a predetermined pressure. For example, the inner pressure of the process chamber 51 is adjusted to a pressure of 10 Pa or more and 102,000 Pa or less. Specifically, the opening degree of the pressure regulator 13 is feedback-controlled based on the pressure information detected by the pressure sensor 15 to adjust the inner pressure of the process chamber 51 to the predetermined pressure while the vacuum pump 14 exhausts an inner atmosphere of the process chamber 51.

In the step S3, simultaneously with adjusting the inner pressure of the process chamber 51, the electromagnetic wave supplier 90 may be controlled as a preliminary heating such that the inner atmosphere of the process chamber 51 is heated to a predetermined temperature by transmitting the microwave from the microwave generators 91 and 92. For example, the microwave of 2.45 GHz and 1 kW or more and 30 kW or less is transmitted by the microwave generators 91 and 92. When the inner temperature the process chamber 51 is elevated to a predetermined substrate processing temperature, in order to prevent the wafer 2 from being deformed or damaged, it is preferable to elevate the inner temperature of the process chamber 51 while the output of the electromagnetic wave supplier 90 is controlled to be less than that of the electromagnetic wave supplier 90 when the modification process described later is performed. In addition, when the substrate processing is performed under the atmospheric pressure, an inert gas supply (step S4) described later may be performed after adjusting only the inner temperature of the process chamber 51 without adjusting the inner pressure of the process chamber 51.

(4) Inert Gas Supply (Step S4)

After the inner pressure and the inner temperature of the process chamber 51 are adjusted to predetermined values by performing the step S3, the driving structure 59 rotates the shaft 58 to rotate the wafer 2 accommodated in the boat 8 on the mounting table 56. While the driving structure 59 rotates the wafer 2, the inert gas serving as the cooling gas is supplied into the process chamber 51 through the gas introducer 20. For example, the nitrogen gas is used as the inert gas. Specifically, the nitrogen gas is supplied from the gas supply source (not shown) into the standby region 57 at a lower portion of the process chamber 51 through the supply port 21a of the supply pipe 21 with the MFC 23 and the valve 22 interposed therebetween.

In the step S4, the operation of the exhauster 10 shown in FIG. 3 is started to exhaust the inner atmosphere of the process chamber 51. Specifically, the operation of the vacuum pump 14 of the exhauster 10 is started, and the inner atmosphere of the process chamber 51 is exhausted by the vacuum pump 14 through the exhaust port 11a of the exhaust pipe 11 with the valve 12 and the pressure regulator 13 interposed therebetween. For example, the inner pressure of the process chamber 51 is adjusted to 10 Pa or more and 102,000 Pa or less, preferably 101,300 Pa or more and 102,000 Pa or less.

(5) Start of Modification Step (Step S5)

While maintaining the inner pressure of the process chamber 51 at a predetermined pressure, the microwave is supplied into the process chamber 51 by the electromagnetic wave supplier 90. By supplying the microwave into the process chamber 51, the wafer 2 is heated to a temperature of 100° C. or more and 1,000° C. or less, preferably 400° C. or more and 900° C. or less. It is more preferable that the wafer 2 is heated to a temperature of 500° C. or more and 700° C. or less.

By performing the substrate processing at the temperature described above, it is possible to for the wafer 2 to efficiently absorb the microwave. Therefore, it is possible to improve the process speed of the modification process of the substrate processing. In other words, when the wafer 2 is processed at a temperature lower than 100° C. or higher than 1,000° C., the surface of the wafer 2 is deformed, so that the microwave is hardly absorbed on the surface of the wafer 2. Thus, it may be difficult to efficiently heat the wafer 2.

In the modification step, the controller 100 determines whether or not the microwave leaking from the process chamber 51 through the loading/unloading port 51*h* and the opening/closing structure 43 is detected by the detection sensors 46*a* shown in FIG. 2 (step S6). Specifically, when at least one of the detection sensors 46*a* detects the microwave at a predetermined level (for example, 5 mW/cm$^2$ or higher), the controller 100 determines that the microwave leaking from the process chamber 51 is detected by the detection sensors 46*a*.

When the controller 100 determines that the microwave is detected by the detection sensors 46*a*, the controller 100 further determines whether or not the detected state has continued for a threshold time (for example, 5 seconds) (step S7). Specifically, when a time duration in which the microwave above the predetermined level continues to be detected by at least one of the detection sensors 46*a* has reached the threshold time, the controller 100 determines that the microwave is leaking. When it is determined that the microwave is leaking, the controller 100 stops the transmission of the microwave by the microwave generators 91 and 92 (step S8). Then, a series of operations of determining the microwave leakage may be completed.

When the controller 100 determines that the microwave is not detected by any of the detection sensors 46*a* in the step S6 or when the controller 100 determines that the microwave is not leaking in the step S7, the controller 100 further determines whether or not the modification step is completed (step S9). Specifically, it is determined whether or not a pre-set process time has elapsed, and when the process time has not elapsed (that is, when the modification step has not been completed), the step S6 is performed again. By performing the modification step, the wafer 2 is heated, and the amorphous silicon film formed on the surface of the wafer 2 is modified (crystallized) into a polysilicon film. That is, it is possible to form a uniformly crystallized polysilicon film on the wafer 2. On the other hand, when it is determined that the process time has elapsed, the rotation of the boat 8, the supply of the cooling gas, the supply of the microwave and the exhaust of the process chamber 5 are stopped, and the modification step is completed.

(6) Inert Gas Supply (Step S10)

When it is determined in the step S9 that the modification step is completed, the inner pressure of the process chamber 51 is adjusted to be lower than an inner pressure of the transfer chamber 4 by adjusting the pressure regulator 13. Then, the opening/closing structure 43 is opened. Thus, the purge gas circulating inside the transfer chamber 4 is exhausted from the lower portion toward the upper portion of the process chamber 51. As a result, it is possible to effectively suppress the heat build-up in the upper portion of the process chamber 51.

(7) Substrate Unloading Step (Step S11)

By opening the opening/closing structure 43, the process chamber 51 is in communication with the transfer chamber 4. Thereafter, the wafer 2 accommodated in the boat 8 after the modification step is transferred out of the process chamber 51 into the transfer chamber 4 by the tweezers 71 and 72 of the transfer structure 7.

(8) Substrate Cooling Step (Step S12)

The wafer 2 unloaded by the tweezers 71 and 72 is moved to the cooling chamber 9 by consecutive operations of the transfer device 73 and the transfer device elevator 74. Then, the wafer 2 is placed on the wafer cooling retainer 9*b* by the tweezer 71.

According to the present embodiment, the wafer cooling retainer 9*b* may include a top plate of a disk shape above the wafer cooling table 9*a* on which the wafer 2 is placed. A diameter of the top plate may be equal to or greater than a diameter of the wafer 2. Thereby, a downflow (DF shown in FIG. 8) from an upper portion of transfer housing 41 is not directly sprayed on the wafer 2. As a result, it is possible to suppress the non-uniform cooling of the wafer 2 due to the rapid cooling, and it is also possible to effectively prevent (or suppress) the wafer 2 from being deformed.

(9) Substrate Accommodating Step (Step S13)

The wafer 2 cooled in the cooling chamber 9 is accommodated in a predetermined position by consecutive operations of the transfer device 73 and the transfer device elevator 74. While the present embodiment is described by way of an example in which the substrate processing is performed in the process chamber 51 described above shown in FIG. 4 with the boat 8 accommodating three wafers including the wafer 2 disposed in the process chamber 51, the present embodiment is not limited thereto. For example, the number of the wafers accommodated in the boat 8 is not limited to three. For example, two wafers including the wafer 2 may be accommodated in the boat 8 of the process chamber 51 and the boat 8 of the process chamber 52, respectively, and the same substrate processing may be performed in parallel. Then, and then two wafers including the wafer 2 may be cooled.

Effects According to First Embodiment

According to the first embodiment, it is possible to provide one or more advantageous effects described below.

(1) According to the first embodiment, the detection sensors 46*a* and the detection sensors 46*b* are arranged around the loading/unloading ports 51*h* and 52*h* in the transfer chamber 4. Therefore, it is possible to prevent the electronic components arranged inside the transfer chamber 4 from malfunctioning or being damaged due to the microwave leakage into the transfer chamber 4.

(2) According to the first embodiment, the plurality of the detection sensors (for example, three detection sensors) 46*a* and the plurality of the detection sensors (for example, three detection sensors) 46*b* are arranged around the loading/unloading ports 51*h* and 52*h* in the transfer chamber 4. Therefore, it is possible to suppress the erroneous detection as compared with a case where only one detection sensor configured to detect the microwave is provided. In other words, it is possible to improve the detection accuracy of detecting the microwave leakage by using the detection sensors 46*a* and the detection sensors 46*b*.

(3) According to the first embodiment, when the time duration in which the microwave continues to be detected by at least one of the detection sensors 46*a* has reached the threshold time, the controller 100 determines that the microwave is leaking. Therefore, it is possible to suppress the erroneous detection as compared with a case where it is determined that the microwave is leaking only by detecting the microwave by the detection sensors. In other words, it is possible to improve the detection accuracy of detecting the microwave leakage.

(4) According to the first embodiment, since the detection accuracy of detecting the microwave leakage is improved, it is possible to suppress stopping of the apparatus such as the substrate processing apparatus 1 due to the erroneous detection of the microwave leakage. As a result, it is possible to shorten the time (which is a cycle time) of performing the substrate processing.

(5) According to the first embodiment, the microwave generators 91 and 91 are arranged so as to face the loading/unloading ports 51h and 52h with the process chamber 5 interposed therebetween. Therefore, the detection sensors 46a and the detection sensors 46b can detect the microwave transmitted from the microwave generators 91 and 91 and leaking through the loading/unloading ports 51h and 52h.

(6) According to the first embodiment, the range within which the detection sensors (for example, three detection sensors) 46a are arranged in the vertical direction covers the opening area of the loading/unloading port 51h. Therefore, it is possible to improve the detection accuracy of detecting the microwave leakage as compared with a case where a range within which detection sensors are arranged in the vertical direction fails to cover the opening area of a loading/unloading port.

Second Embodiment

Figure 9:
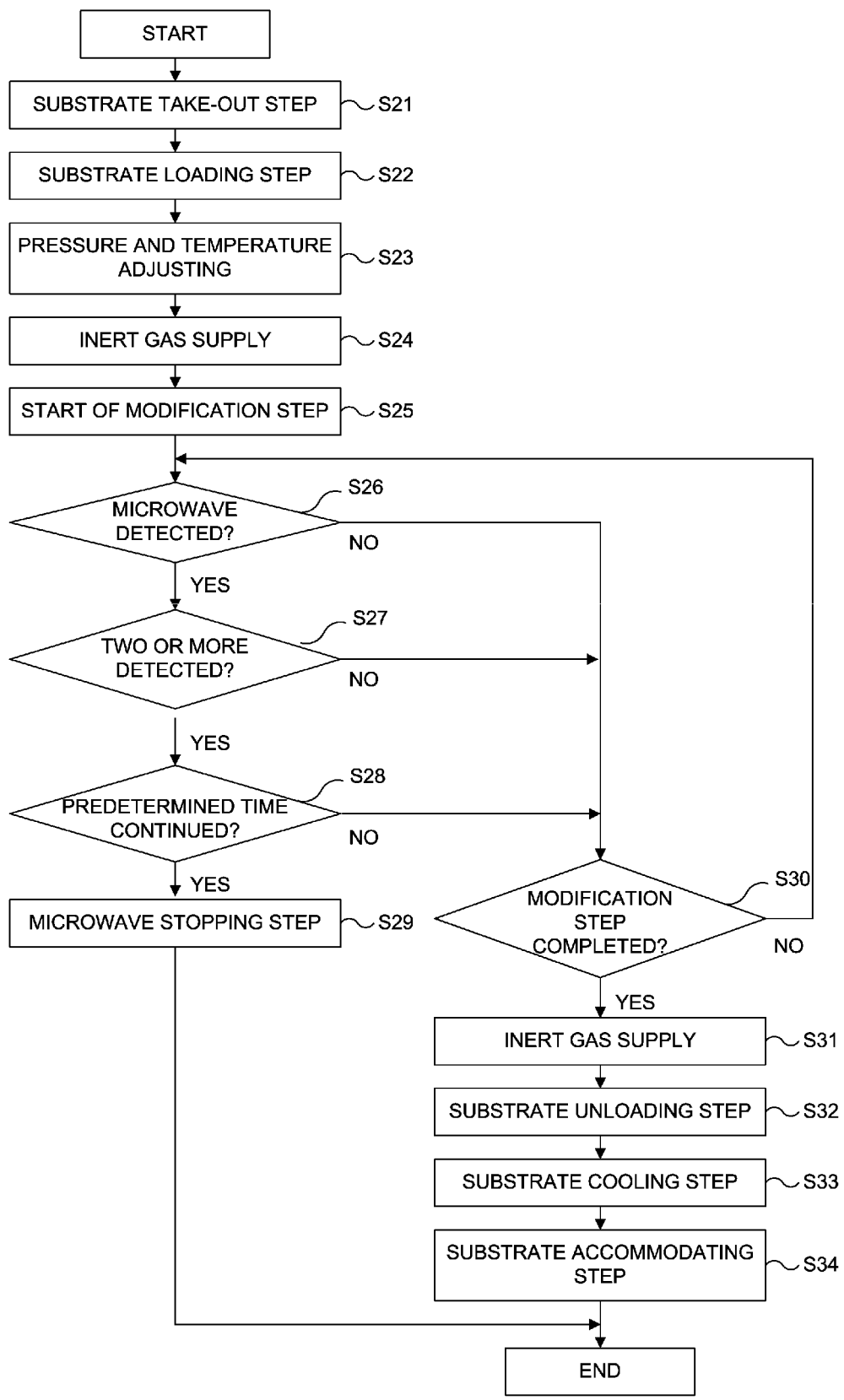
FIG. 9 is a flow chart schematically illustrating step of a substrate processing of a substrate processing apparatus according a second embodiment described herein.

An example of a substrate processing apparatus, a method of manufacturing a semiconductor device and a non-transitory computer-readable recording medium according to the second embodiment described herein will be described. Specifically, the substrate processing performed by the substrate processing apparatus 1 according to the second embodiment will be described with reference to a flow chart shown in FIG. 9. Hereinafter, the difference between the second embodiment and the first embodiment will be mainly described.

A substrate take-out step (step S21) of the second embodiment is substantially the same as the substrate take-out step (step S1) of the first embodiment, and a substrate loading step (step S22) of the second embodiment is substantially the same as the substrate loading step (step S2) of the first embodiment. An inner pressure and inner temperature of furnace adjusting (step S23) of the second embodiment is substantially the same as the inner pressure and the inner temperature of the furnace adjusting (step S3) of the first embodiment, and an inert gas supply (step S24) of the second embodiment is substantially the same as the inert gas supply (step S4) of the first embodiment.

(1) Start of Modification Step (Step S25)

While maintaining the inner pressure of the process chamber 51 at a predetermined pressure, the microwave is supplied into the process chamber 51 by the electromagnetic wave supplier 90. By supplying the microwave into the process chamber 51, the wafer 2 is heated to a temperature of 100° C. or more and 1,000° C. or less, preferably 400° C. or more and 900° C. or less. It is more preferable that the wafer 2 is heated to a temperature of 500° C. or more and 700° C. or less.

By performing the substrate processing at the temperature described above, it is possible to for the wafer 2 to efficiently absorb the microwave. Therefore, it is possible to improve the process speed of the modification process of the substrate processing. In other words, when the wafer 2 is processed at a temperature lower than 100° C. or higher than 1,000° C., the surface of the wafer 2 is deformed, so that the microwave is hardly absorbed on the surface of the wafer 2. Thus, it may be difficult to efficiently heat the wafer 2.

In the modification step, the controller 100 determines whether or not the microwave leaking from the process chamber 51 through the loading/unloading port 51h and the opening/closing structure 43 is detected by at least one of the detection sensors 46a (step S26). Specifically, when at least one of the detection sensors 46a detects the microwave at a predetermined level (for example, 5 mW/cm$^2$ or higher), the controller 100 determines that the microwave leaking from the process chamber 51 is detected by at least one of the detection sensors 46a.

When the controller 100 determines that the microwave is detected by at least one of the detection sensors 46a, the controller 100 further determines whether or not the number of the detection sensors 46a that detected the microwave is two or more (step S27).

When the controller 100 determines that the number of the detection sensors 46a that detected the microwave is two or more, the controller 100 further determines whether or not the detected state has continued for a threshold time (for example, 5 seconds) (step S28). Specifically, when each time duration in which the microwave above the predetermined level continues to be detected by two or more detection sensors has reached the threshold time, the controller 100 determines that the microwave is leaking. In other words, when each of the two or more detection sensors continues to detect the microwave above the predetermined level over a time duration longer than the threshold time, the controller 100 determines that the microwave is leaking.

When it is determined that the microwave is leaking, the controller 100 is configured to stop the transmission of the microwave by the microwave generators 91 and 92 (step S29). Then, a series of operations of determining the microwave leakage may be completed.

When (i) the controller 100 determines that the microwave is not detected by any of the detection sensors 46a in the step S26, or (ii) the controller 100 determines that only one of the detection sensors 46a detected the microwave in the step S27, or (iii) the controller 100 determines that the microwave is not leaking in the step S28, the controller 100 further determines whether or not the modification step is completed (step S30). Specifically, it is determined whether or not a pre-set process time has elapsed. When the process time has not elapsed (that is, when the modification step has not been completed), the step S26 is performed again. By performing the modification step, the wafer 2 is heated, and the amorphous silicon film formed on the surface of the wafer 2 is modified (crystallized) into a polysilicon film. That is, it is possible to form a uniformly crystallized polysilicon film on the wafer 2.

On the other hand, when it is determined that the process time has elapsed, the rotation of the boat 8, the supply of the cooling gas, the supply of the microwave and the exhaust of the process chamber 5 are stopped, and the modification step is completed.

An inert gas supply (step S31) of the second embodiment after the modification step is completed is substantially the same as the inert gas supply (step S10) of the first embodiment, and a substrate unloading step (step S32) of the second embodiment is substantially the same as the substrate unloading step (step S11) of the first embodiment. A substrate cooling step (step S33) of the second embodiment is substantially the same as the substrate cooling step (step S12) of the first embodiment, and a substrate accommodating step (step S34) of the second embodiment is substantially the same as the substrate accommodating step (step S13) of the first embodiment.

Effects According to Second Embodiment (1) According to the second embodiment, when two or more of the detection sensors 46a detect the microwave and each time duration in which the microwave continues to be detected by the two or more detection sensors has reached the threshold time, the controller 100 determines that the microwave is leaking. Therefore, it is possible to suppress the erroneous detection as compared with a case where it is determined that the microwave is leaking when only one of the detection sensors 46a detected the microwave and the time duration in which the microwave continues to be detected by the only detection sensor has reached the threshold time. In other words, it is possible to improve the detection accuracy of detecting the microwave leakage by using the detection sensors 46a.

The other effects according to the second embodiment are the same as those of the first embodiment.

Other Embodiments

While the technique is described in detail by way of the above-described embodiments, the above-described technique is not limited thereto. It is apparent to the person skilled in the art that the above-described technique may be modified in various ways without departing from the scope thereof. For example, the first embodiment and the second embodiment described above are described by way of an example in which three detection sensors serving as the detection sensors 46a and three detection sensors serving as the detection sensors 46b configured to detect the microwave leaking to the transfer chamber 4 through the loading/unloading ports 51h and 52h are installed. However, the above-described technique is not limited thereto. For example, the above-described technique may be applied when a single detection sensor is installed to detect the microwave leaking to the transfer chamber 4 through the loading/unloading port 51h and a single detection sensor is installed to detect the microwave leaking to the transfer chamber 4 through the loading/unloading port 52h. Further, the above-described technique may also be applied when two detection sensors serving as the detection sensors 46a and two detection sensors serving as the detection sensors 46b are installed, or when four or more detection sensors serving as the detection sensors 46a and four or more detection sensors serving as the detection sensors 46b are installed.

Figure 10:
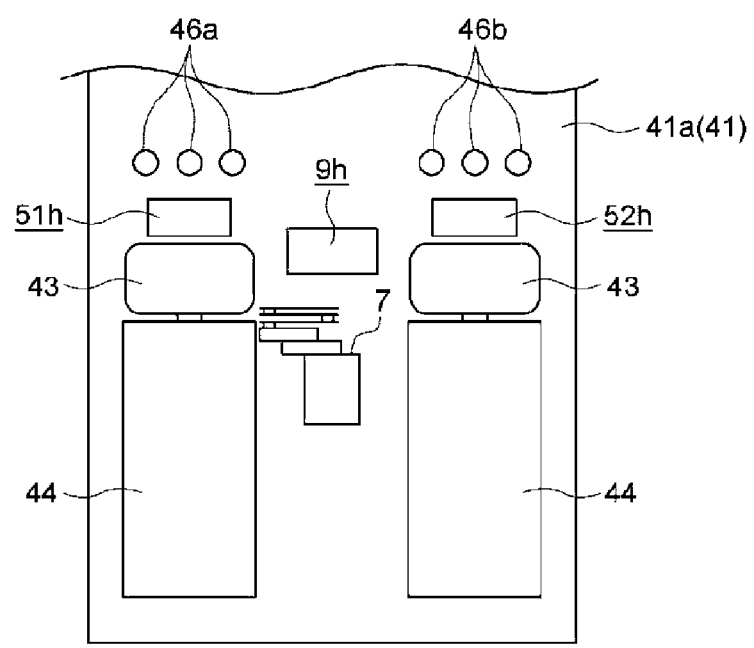
FIG. 10 schematically illustrates a substrate processing apparatus according a modified example of the embodiments described above when viewed from an inside of a transfer chamber thereof toward a loading/unloading port thereof.

For example, the first embodiment and the second embodiment described above are described by way of an example in which the detection sensors 46a and the detection sensors 46b are installed on the sides of the loading/unloading ports 51h and 52h. However, the above-described technique is not limited thereto. For example, the above-described technique may be applied when the detection sensors 46a and the detection sensors 46b are installed above the loading/unloading ports 51h and 52h as shown in FIG. 10.

When the detection sensors 46a and the detection sensors 46b are installed above the loading/unloading ports 51h and 52h, a range within which the detection sensors (for example, three detection sensors) 46a and the detection sensors (for example, three detection sensors) 46b are arranged in the apparatus depth direction covers the opening areas of the loading/unloading ports 51h and 52h. Therefore, it is possible to improve the detection accuracy of detecting the microwave leakage as compared with a case where a range within which detection sensors are arranged in the apparatus depth direction fails to cover the opening areas of the loading/unloading ports 51h and 52h.

For example, the second embodiment described above is described by way of an example in which, when two or more of the detection sensors 46a detect the microwave and each time duration in which the microwave continues to be detected by the two or more detection sensors has reached the threshold time, the controller 100 determines that the microwave is leaking. However, the above-described technique is not limited thereto. For example, the above-described technique may be applied when the controller 100 determines that the microwave is leaking when the majority of the plurality of the detection sensors detect the microwave and each time duration in which the microwave continues to be detected by the majority of the plurality of the detection sensors has reached the threshold time.

For example, the first embodiment and the second embodiment described above are described by way of an example in which the modification process of modifying the amorphous silicon film formed on the wafer 2 into the polysilicon film is performed. However, the above-described technique is not limited thereto.

More specifically, for example, the above-described technique may be applied when a film formed on a surface of a substrate is modified by supplying a gas containing at least one selected from the group of oxygen (O), nitrogen (N), carbon (C), hydrogen (H) and the like. For example, when a hafnium oxide film (HfxOy film) serving as a high dielectric constant film is formed on the wafer, it is possible to improve the characteristics of the high dielectric constant film by supplying a gas containing oxygen and the heating the gas containing oxygen and the hafnium oxide film by supplying the microwave to replenish the deficient oxygen in the hafnium oxide film. While the hafnium oxide film is exemplified above, the above-described technique may also be applied when an oxide film (that is, a metal-based oxide film) containing at least one metal element selected from the group of aluminum (Al), titanium (Ti), zirconium (Zr), tantalum (Ta), niobium (Nb), lanthanum (La), cerium (Ce), yttrium (Y), barium (Ba), strontium (Sr), calcium (Ca), lead (Pb), molybdenum (Mo), tungsten (W) and the like.

That is, the above-described technique may also be applied to modify a film formed on the wafer 2, such as a TiOCN film, a TiOC film, a TiON film, a TiO film, a ZrOCN film, a ZrOC film, a ZrON film, a ZrO film, an HfOCN film, an HfOC film, an HfON film, an HfO film, a TaOCN film, a TaOC film, a TaON film, a TaO film, a NbOCN film, a NbOC film, a NbON film, a NbO film, a AlOCN film, a AlOC film, a AlON film, a AlO film, a MoOCN film, a MoOC film, a MoON film, a MoO film, a WOCN film, a WOC film, a WON film and a WO film.

Further, the above-described technique may also be applied when a film containing silicon as a main component and doped with impurities is heated instead of the high dielectric constant film. As the film containing silicon as the main component, a silicon-based film such as a silicon nitride film (SiN film), a silicon oxide film (SiO film), a silicon oxycarbide film (SiOC film), a silicon oxycarbonitride film (SiOCN film) and a silicon oxynitride film (SiON film) may be used. As the impurities, for example, at least one selected from the group of boron (B), carbon (C), nitrogen (N), aluminum (Al), phosphorus (P), gallium (Ga), arsenic (As) and the like may be used.

Further, for example, the above-described technique may also be applied to a photoresist film based on at least one selected from the group of methyl methacrylate resin (PMMA: Polymethylmethacrylicate), epoxy resin, novolak resin, polyvinyl phenyl resin and the like.

Further, for example, the above-described technique may be applied to a substrate processing such as a patterning process of manufacturing processes of a liquid crystal panel, a patterning process of manufacturing processes of a solar cell and a patterning process of manufacturing processes of a power device.

As described above, according to some embodiments in the present disclosure, it is possible to prevent the electronic components arranged inside the transfer chamber from malfunctioning or being damaged due to the microwave leakage into the transfer chamber.

What is claimed is:

1. A substrate processing apparatus comprising:
   a process housing comprising a process chamber in which a substrate is processed;
   a transfer housing provided adjacent to the process housing and comprising a transfer chamber wherein the substrate is transferred between the process chamber and the transfer chamber;
   a microwave generator configured to transmit a microwave to be supplied into the process chamber;
   a loading/unloading port connecting between the process chamber and the transfer chamber and through which the substrate is transferred;
   an opening/closing structure configured to open or close the loading/unloading port;
   a plurality of detection sensors provided in the transfer chamber adjacent to the loading/unloading port and configured to detect the microwave leaking to the transfer chamber from the process chamber through the loading/unloading port while the opening/closing structure maintains the loading/unloading port closed; and
   a controller configured to control the microwave generator to stop a transmission of the microwave when each time duration of the microwave being detected by two or more detection sensors among the plurality of detection sensors has reached a threshold time.

2. The substrate processing apparatus of claim 1, wherein the plurality of detection sensors are provided on an inner wall of the transfer housing, wherein the loading/unloading port is provided on the inner wall.

3. The substrate processing apparatus of claim 1, wherein the controller is further configured to control the microwave generator to stop a transmission of the microwave when a time duration of the microwave being detected by one of the detection sensors has reached a threshold time.

4. The substrate processing apparatus of claim 1, wherein the microwave generator is arranged so as to face the loading/unloading port with the process chamber interposed therebetween.

5. The substrate processing apparatus of claim 1, wherein a distance between one of the detection sensors and the loading/unloading port is equal to or less than half an opening width of the loading/unloading port.

6. The substrate processing apparatus of claim 1, wherein the process chamber comprises a first process chamber and a second process chamber, and
   wherein the detection sensors comprise:
      a first detection sensor arranged at a position beyond reach of the microwave leaking from the second process chamber and configured to detect the microwave leaking from the first process chamber to the transfer chamber; and
      a second detection sensor arranged at a position beyond reach of the microwave leaking from the first process chamber and configured to detect the microwave leaking from the second process chamber to the transfer chamber.

7. The substrate processing apparatus of claim 6, wherein a plurality of detection sensors comprising the first detection sensor are arranged at positions beyond reach of the microwave leaking from the second process chamber and a plurality of detection sensors comprising the second detection sensor are arranged at positions beyond reach of the microwave leaking from the first process chamber.

8. A method of manufacturing a semiconductor device, comprising:
   (a) loading a substrate into a process chamber of a substrate processing apparatus, wherein the substrate processing apparatus comprises:
      a process housing comprising the process chamber in which the substrate is processed;
      a transfer housing provided adjacent to the process housing and comprising a transfer chamber wherein the substrate is transferred between the process chamber and the transfer chamber;
      a microwave generator configured to transmit a microwave to be supplied into the process chamber;
      a loading/unloading port connecting between the process chamber and the transfer chamber and through which the substrate is transferred;
      an opening/closing structure configured to open or close the loading/unloading port;
      a plurality of detection sensors provided in the transfer chamber adjacent to the loading/unloading port and configured to detect the microwave leaking to the transfer chamber from the process chamber through the loading/unloading port while the opening/closing structure maintains the loading/unloading port closed; and
      a controller configured to control the microwave generator to stop a transmission of the microwave when each time duration of the microwave being detected by two or more detection sensors among the plurality of detection sensors has reached a threshold time;
   (b) processing the substrate by the microwave transmitted by the microwave generator; and
   (c) detects the microwave leaking into the transfer chamber by the detection sensors.

9. A non-transitory computer-readable recording medium storing a program that causes, by a computer, a substrate processing apparatus to perform:
   (a) loading a substrate into a process chamber of the substrate processing apparatus, wherein the substrate processing apparatus comprises:
      a process housing comprising the process chamber in which the substrate is processed;
      a transfer housing provided adjacent to the process housing and comprising a transfer chamber wherein the substrate is transferred between the process chamber and the transfer chamber;
      a microwave generator configured to transmit a microwave to be supplied into the process chamber;
      a loading/unloading port connecting between the process chamber and the transfer chamber and through which the substrate is transferred;
      an opening/closing structure configured to open or close the loading/unloading port;
      a plurality of detection sensors provided in the transfer chamber adjacent to the loading/unloading port and configured to detect the microwave leaking to the transfer chamber from the process chamber through the loading/unloading port while the opening/closing structure maintains the loading/unloading port closed; and
      a controller configured to control the microwave generator to stop a transmission of the microwave when each time duration of the microwave being detected by two or more detection sensors among the plurality of detection sensors has reached a threshold time;
(b) processing the substrate by the microwave transmitted by the microwave generator; and
(c) detects the microwave leaking into the transfer chamber by the detection sensors.

* * * * *